US010399186B2

(12) United States Patent
Pan et al.

(10) Patent No.: US 10,399,186 B2
(45) Date of Patent: Sep. 3, 2019

(54) LEAD-FREE EUTECTIC SOLDER ALLOY COMPRISING ZINC AS THE MAIN COMPONENT AND ALUMINUM AS AN ALLOYING METAL

(71) Applicant: Heraeus Materials Singapore, PTE., Ltd., Singapore (SG)

(72) Inventors: Wei Chih Pan, Singapore (SG); Joseph Aaron Mesa Baquiran, Singapore (SG); Inciong Reynoso, Singapore (SG)

(73) Assignee: Heraeus Materials Singapore Pte., Ltd., Singapore (SG)

( * ) Notice: Subject to any disclaimer, the term of this patent is extended or adjusted under 35 U.S.C. 154(b) by 332 days.

(21) Appl. No.: 15/304,162

(22) PCT Filed: Apr. 15, 2015

(86) PCT No.: PCT/SG2015/050073
§ 371 (c)(1),
(2) Date: Oct. 14, 2016

(87) PCT Pub. No.: WO2015/160311
PCT Pub. Date: Oct. 22, 2015

(65) Prior Publication Data
US 2017/0036307 A1  Feb. 9, 2017

(30) Foreign Application Priority Data

Apr. 17, 2014 (SG) ............................ 10201401618Y
May 28, 2014 (SG) ............................ 10201402705V

(51) Int. Cl.
| B23K 35/28 | (2006.01) |
| B23K 35/02 | (2006.01) |
| B23K 1/00 | (2006.01) |
| C22C 18/00 | (2006.01) |
| C22C 18/04 | (2006.01) |
| B23K 35/26 | (2006.01) |
| H01L 23/495 | (2006.01) |
| H01L 23/498 | (2006.01) |
| C22C 11/00 | (2006.01) |
| C22C 13/00 | (2006.01) |

(52) U.S. Cl.
CPC .......... *B23K 35/282* (2013.01); *B23K 1/0016* (2013.01); *B23K 35/025* (2013.01); *B23K 35/0227* (2013.01); *B23K 35/262* (2013.01); *B23K 35/268* (2013.01); *C22C 18/00* (2013.01); *C22C 18/04* (2013.01); *H01L 23/4952* (2013.01); *H01L 23/49811* (2013.01); *C22C 11/00* (2013.01); *C22C 13/00* (2013.01)

(58) Field of Classification Search
None
See application file for complete search history.

(56) References Cited

U.S. PATENT DOCUMENTS

| 2001/0029095 A1* | 10/2001 | Tadauchi | B23K 35/282 |
| | | | 438/612 |
| 2002/0149114 A1* | 10/2002 | Soga | C22C 18/04 |
| | | | 257/772 |
| 2003/0224197 A1 | 12/2003 | Soga et al. | |
| 2012/0313230 A1 | 12/2012 | Mengel et al. | |
| 2013/0045131 A1 | 2/2013 | Li et al. | |
| 2013/0251587 A1 | 9/2013 | Iseki | |
| 2014/0191250 A1* | 7/2014 | Tanimoto | B23K 1/0016 |
| | | | 257/77 |
| 2016/0082552 A1* | 3/2016 | Yamazaki | B23K 35/282 |
| | | | 257/771 |

FOREIGN PATENT DOCUMENTS

| CN | 103249519 A | 8/2013 |
| CN | 103639615 A | 3/2014 |
| CN | 103934590 A | 7/2014 |
| DE | 1173770 B | 7/1964 |
| EP | 1250032 A1 | 10/2002 |
| JP | 134485 C | 12/1939 |
| JP | S62-173095 A | 7/1987 |
| JP | H11172353 A | 6/1999 |
| JP | H11207487 A | 8/1999 |
| JP | H11288955 A | 10/1999 |
| JP | 200061686 A | 2/2000 |
| JP | 2000208533 A | 7/2000 |
| JP | 2003-260587 A | 9/2003 |
| JP | 2004358540 A | 12/2004 |
| JP | 2011235314 A | 11/2011 |
| JP | 2011251332 A | 12/2011 |
| JP | 2012183558 A | 9/2012 |
| JP | 2012228729 A | 11/2012 |
| JP | 201330607 A | 2/2013 |
| JP | 2013-52433 A | 3/2013 |

OTHER PUBLICATIONS

English translation of JPH 11/288955, Oct. 1999; 8 pages.*
English translation of JP 2011/251332, Dec. 2011; 17 pages.*
English translation of JP 2013/052433, Mar. 2013; 17 pages.*
English translation of JPH 11/172353, Jun. 1999; 7 pages.*
English translation of CN 103639615, Mar. 2014; 4 pages.*
Office Action dated Feb. 5, 2018 in KR Application No. 10-2016-7027102.
Search Report dated May 2, 2017 in EP Application No. 17159528.3.
Search Report dated May 2, 2017 in EP Application No. 17159539.0.
Shimizu et al., "Zn—Al—Mg—Ga Alloys as Pb-Free Solder for Die-Attaching Use", Jour. of Electronic Materials, vol. 28, No. 11, pp. 1172-1175 (Jan. 1, 1999).
Rettenmayr et al., "Zn—Al Based Alloys as Pb-Free Solders for Die Attach", Jour. of Electronic Materials, vol. 31, No. 4, pp. 278-285 (Apr. 1, 2002).

(Continued)

Primary Examiner — Helene Klemanski
(74) Attorney, Agent, or Firm — Panitch Schwarze Belisario & Nadel LLP

(57) ABSTRACT

A lead-free solder alloy contains zinc (Zn) as the main component and aluminum (Al) as an alloying metal. The solder alloy is a eutectic having a single melting point in the range of 320 to 390° C. (measured by DSC at a heating rate of 5° C. min-1).

35 Claims, No Drawings

(56) References Cited

OTHER PUBLICATIONS

Li et al., "Phase Formation Sequence of High-Temperature Zn—4Al—3Mg Solder", Jour. Mater. Sci Electronic, vol. 24, No. 1, pp. 336-344 (May 20, 2012).
Int'l Search Report dated Nov. 12, 2015 in Int'l Application No. PCT/SG2015/050073.
Office Action dated Oct. 3, 2017 in JP Application No. 2016-560991.
Office Action and Search Report dated Jun. 5, 2018 in CN Application No. 201580020174.7.
Office Action dated Nov. 13, 2018 in KR Application No. 10-2018-7028770.
Office Action dated Jan. 21, 2019 in CN Application No. 201580020174.7.

* cited by examiner

LEAD-FREE EUTECTIC SOLDER ALLOY COMPRISING ZINC AS THE MAIN COMPONENT AND ALUMINUM AS AN ALLOYING METAL

CROSS-REFERENCE TO RELATED APPLICATIONS

This application is a Section 371 of International Application No. PCT/SG2015/050073, filed Apr. 15, 2015, which was published in the English language on Oct. 22, 2015 under International Publication No. WO 2015/160311 A8 and the disclosure of which is incorporated herein by reference.

BACKGROUND OF THE INVENTION

The invention is directed to a lead-free eutectic solder alloy comprising zinc (Zn) as the main component and aluminum (Al) as an alloying metal. The invention is also directed to the use of the lead-free eutectic solder alloy.

Legislation driven by environmental and health concerns is still driving the replacement of lead-containing solder alloys with lead-free alternatives. However, the alternative solder alloy's melting temperature, or to be more precise, its solidus temperature must be high enough, especially with regard to applications in which the finished solder joints experience high temperature as the case may be either in later process steps and/or under field conditions. In die-attach applications, for example, a melting temperature of the solder alloy in the range of 280 to 400° C. is required.

US 2013/0045131 A1 discloses lead-free zinc base solder compositions comprising 82 to 96 wt. % (weight-%) of zinc, 3 to 15 wt. % of aluminum, 0.5 to 1.5 wt. % of magnesium and 0.5 to 1.5 wt. % of gallium.

JP2000208533 A discloses a lead-free zinc base die-bonding alloy of 2 to 9 wt. % of aluminum, 0.01 to 0.5 wt. % of magnesium, 2 to 9 wt. % of germanium and a remainder of zinc and inevitable impurities.

US2012/0313230 A1 claims several lead-free zinc base solder alloys, one with 8 to 20 wt. % of aluminum, 0.5 to 20 wt. % of magnesium and 0.5 to 20 wt. % of gallium, a further one with 1 to 30 wt. % of aluminum, 0.5 to 20 wt. % of magnesium and 0.5 to 6.5 wt. % of tin and also one with 1 to 30 wt. % of aluminum, 0.5 to 20 wt. % of germanium and 0.5 to 20 wt. % of gallium, the rest of the alloys in each case comprising zinc.

JP2012228729 A discloses lead-free zinc base solder alloy comprising 0.01 to 9.0 wt. % of aluminum, at least one of germanium, magnesium, silver and phosphorus in ranges of 0.01 to 8.0 wt. % of germanium, 0.01 to 5.0 wt. % of magnesium, 0.1 to 4.0 wt. % of silver, and at most 0.5 wt. % of phosphorus; and a remainder of Zn and inevitable impurities.

JP11207487 A discloses lead-free zinc base solder alloy consisting of 1 to 7 wt. % of aluminum, 0.5 to 6 wt. % of magnesium, 1 to 25 wt. % of tin, and the balance zinc with inevitable impurities.

US 2013/0251587 A1 claims lead-free zinc base solder alloy consisting of 1.0 to 9.0 wt. % of aluminum, 0.002 to 0.8 wt. % of phosphorus, 0.3 to 3 wt. % of germanium and a balance being zinc with inevitable impurities.

BRIEF SUMMARY OF THE INVENTION

There is a desire to find improved lead-free solder alloys.
The invention relates to a lead-free eutectic solder alloy comprising zinc (Zn) as the main component and aluminum (Al) as an alloying metal. Its eutectic temperature, represented by a single melting point, lies in the range of 320 to 390° C. (measured by DSC at a heating rate of 5° C. min$^{-1}$).

The abbreviation "DSC" used herein means differential scanning calorimetry.

It has been found that the lead-free eutectic solder alloy of the invention can be used as solder metal or in solder compositions, in particular for use in the electronics and microelectronics field.

The solder joints made from solder compositions comprising or consisting of the lead-free eutectic solder alloy of the invention exhibit surprisingly improved thermal characteristics, microstructural characteristics and reliability. These characteristics result in better performance of products made using these alloys.

DETAILED DESCRIPTION OF THE INVENTION

In a first embodiment, the lead-free eutectic solder alloy of the invention comprises 3.8 to 4.0 wt. % of aluminum (Al) and 2.2 to 2.25 wt. % of magnesium (Mg).

In a first alternative of the first embodiment, the lead-free eutectic solder alloy consists of 3.8 wt. % of aluminum (Al), 2.2 wt. % of magnesium (Mg), a total of 0 to 0.5 wt. % of one or more doping elements selected among germanium (Ge), phosphorus (P), nickel (Ni), bismuth (Bi), antimony (Sb) and silicon (Si), and of zinc (Zn) as the remainder to make up 100 wt. %. The alloy exhibits a single melting point at 350° C. (measured by DSC at a heating rate of 5° C. min$^{-1}$).

In a second alternative of the first embodiment, the lead-free eutectic solder alloy consists of 3.8 wt. % of aluminum (Al), 2.2 wt. % of magnesium (Mg), 5 wt. % of tin (Sn), a total of 0 to 0.5 wt. % of one or more doping elements selected among germanium (Ge), phosphorus (P), nickel (Ni), bismuth (Bi), antimony (Sb) and silicon (Si), and of zinc (Zn) as the remainder to make up 100 wt. %. The alloy exhibits a single melting point at 339° C. (measured by DSC at a heating rate of 5° C. min$^{-1}$).

In a third alternative of the first embodiment, the lead-free eutectic solder alloy consists of 3.8 wt. % of aluminum (Al), 2.2 wt. % of magnesium (Mg), 6 wt. % of tin (Sn), 2 wt. % of silver (Ag), a total of 0 to 0.5 wt. % of one or more doping elements selected among germanium (Ge), phosphorus (P), nickel (Ni), bismuth (Bi), antimony (Sb) and silicon (Si), and of zinc (Zn) as the remainder to make up 100 wt. %. The alloy exhibits a single melting point at 340° C. (measured by DSC at a heating rate of 5° C. min$^{-1}$).

In a fourth alternative of the first embodiment, the lead-free eutectic solder alloy consists of 4.0 wt. % of aluminum (Al), 2.25 wt. % of magnesium (Mg), 5.85 wt. % of silver (Ag), a total of 0 to 0.5 wt. % of one or more doping elements selected among germanium (Ge), phosphorus (P), nickel (Ni), bismuth (Bi), antimony (Sb) and silicon (Si), and of zinc (Zn) as the remainder to make up 100 wt. %. The alloy exhibits a single melting point at 352° C. (measured by DSC at a heating rate of 5° C. min$^{-1}$).

In a second embodiment, the lead-free eutectic solder alloy comprises 6.0 wt. % of aluminum (Al) and 6.0 to 7.2 wt. % of germanium (Ge).

In a first alternative of the second embodiment, the lead-free eutectic solder alloy consists of 6.0 wt. % of aluminum (Al), 6.5 wt. % of germanium (Ge), a total of 0 to 0.5 wt. % of one or more doping elements selected among phosphorus (P), nickel (Ni), bismuth (Bi), antimony (Sb) and silicon (Si), and of zinc (Zn) as the remainder to make up 100 wt. %. The alloy exhibits a single melting point at 368° C. (measured by DSC at a heating rate of 5° C. min$^{-1}$).

In a second alternative of the second embodiment, the lead-free eutectic solder alloy consists of 6.0 wt. % of aluminum (Al), 7.2 wt. % of germanium (Ge), a total of 0 to 0.5 wt. % of one or more doping elements selected among phosphorus (P), nickel (Ni), bismuth (Bi), antimony (Sb) and silicon (Si), and of zinc (Zn) as the remainder to make up 100 wt. %. The alloy exhibits a single melting point at 361° C. (measured by DSC at a heating rate of 5° C. min$^{-1}$).

In a third alternative of the second embodiment, the lead-free eutectic solder alloy consists of 6.0 wt. % of aluminum (Al), 6.0 wt. % of germanium (Ge), 2.0 wt. % of copper (Cu), 1.25 wt. % of tin (Sn), a total of 0 to 0.5 wt. % of one or more doping elements selected among phosphorus (P), nickel (Ni), bismuth (Bi), antimony (Sb) and silicon (Si), and of zinc (Zn) as the remainder to make up 100 wt. %. The alloy exhibits a single melting point at 358° C. (measured by DSC at a heating rate of 5° C. min$^{-1}$).

In a third embodiment, the lead-free eutectic solder alloy consists of 8.0 wt. % of aluminum (Al), 2.4 wt. % of copper (Cu), a total of 0 to 0.5 wt. % of one or more doping elements selected among phosphorus (P), nickel (Ni), bismuth (Bi), antimony (Sb) and silicon (Si), and of zinc (Zn) as the remainder to make up 100 wt. %. The alloy exhibits a single melting point at 389° C. (measured by DSC at a heating rate of 5° C. min$^{-1}$).

In a fourth embodiment, the lead-free eutectic solder alloy consists of 7.6 wt. % of aluminum (Al), 2.0 wt. % of silver (Ag), 2.0 wt. % of copper (Cu), a total of 0 to 0.5 wt. % of one or more doping elements selected among phosphorus (P), nickel (Ni), bismuth (Bi), antimony (Sb) and silicon (Si), and of zinc (Zn) as the remainder to make up 100 wt. %. The alloy exhibits a single melting point at 390° C. (measured by DSC at a heating rate of 5° C. min$^{-1}$).

In a fifth embodiment, the lead-free eutectic solder alloy consists of 3.8 wt. % of aluminum (Al), 3.28 wt. % of magnesium (Mg), 7 wt. % of tin (Sn), 2.42 wt. % of silver (Ag), a total of 0 to 0.5 wt. % of one or more doping elements selected among phosphorus (P), nickel (Ni), bismuth (Bi), antimony (Sb) and silicon (Si), and of zinc (Zn) as the remainder to make up 100 wt. %. The alloy exhibits a single melting point at 341° C. (measured by DSC at a heating rate of 5° C. min$^{-1}$).

In a sixth embodiment, the lead-free eutectic solder alloy consists of 3.6 wt. % of aluminum (Al), 3.1 wt. % of magnesium (Mg), 7 wt. % of tin (Sn), a total of 0 to 0.5 wt. % of one or more doping elements selected among phosphorus (P), nickel (Ni), bismuth (Bi), antimony (Sb) and silicon (Si), and of zinc (Zn) as the remainder to make up 100 wt. %. The alloy exhibits a single melting point at 343° C. (measured by DSC at a heating rate of 5° C. min$^{-1}$).

In a seventh embodiment, the lead-free eutectic solder alloy of the invention comprises 4.8 to 5.0 wt. % of aluminum (Al), 0.35 to 0.5 wt. % of magnesium (Mg) and 0.5 to 1.0 wt. % of germanium (Ge).

In a first alternative of the seventh embodiment, the lead-free eutectic solder alloy consists of 5.0 wt. % of aluminum (Al), 0.35 wt. % of magnesium (Mg), 1.0 wt. % of germanium (Ge), a total of 0 to 0.5 wt. % of one or more doping elements selected among phosphorus (P), nickel (Ni), bismuth (Bi), antimony (Sb) and silicon (Si), and of zinc (Zn) as the remainder to make up 100 wt. %. The alloy exhibits a single melting point at 375° C. (measured by DSC at a heating rate of 5° C. min$^{-1}$).

In a second alternative of the seventh embodiment, the lead-free eutectic solder alloy consists of 4.8 wt. % of aluminum (Al), 0.45 wt. % of magnesium (Mg), 1.0 wt. % of germanium (Ge), a total of 0 to 0.5 wt. % of one or more doping elements selected among phosphorus (P), nickel (Ni), bismuth (Bi), antimony (Sb) and silicon (Si), and of zinc (Zn) as the remainder to make up 100 wt. %. The alloy exhibits a single melting point at 380° C. (measured by DSC at a heating rate of 5° C. min$^{-1}$).

In an eighth embodiment, the lead-free eutectic solder alloy consists of 6 wt. % of aluminum (Al), 6.5 wt. % of germanium (Ge), 1.7 wt % of copper (Cu), a total of 0 to 0.5 wt. % of one or more doping elements selected among phosphorus (P), nickel (Ni), bismuth (Bi), antimony (Sb) and silicon (Si), and of zinc (Zn) as the remainder to make up 100 wt. %. The alloy exhibits a single melting point at 358° C. (measured by DSC at a heating rate of 5° C. min$^{-1}$).

The phrase "zinc (Zn) as the remainder to make up 100 wt. %" is used herein. It shall mean that zinc is the main component in the respective lead-free eutectic solder alloy, as has already been said above. To avoid misunderstandings, the preceding sentence shall not be understood to exclude other elements which due to prevailing technical conditions may have found their way into the lead-free eutectic solder alloy of the invention, for example, as a consequence of an unintentional but inevitable incorporation during manufacture. In other words, such other elements may be present in the lead-free eutectic solder alloy as inevitable impurities, however only in very minor amounts of, for example, >0 to 0.05 wt. %. In any case such inevitable impurities are not deliberately added or introduced into the alloy forming composition. Insofar, the phrase "zinc (Zn) as the remainder to make up 100 wt. %" means that the wt. % proportion which is missing to make up 100 wt. % of the alloy consists of zinc plus said inevitable impurities, if the latter are present.

The lead-free eutectic solder alloy of the invention can be prepared by conventional processes known to the person skilled in the art of metal alloys, for example, by melting together the zinc, the aluminum and the other necessary components. It is possible to use an induction furnace and it is expedient to work under vacuum or under an inert gas atmosphere. The materials used can have a purity grade of, for example, 99.99 wt. % and above. The metal alloy melt is typically cast in a mold of room temperature in which it cools down and solidifies.

The lead-free eutectic solder alloy of the invention can directly (i.e. as such in metal form) be used as a solder metal. However, from a practical perspective, it must be brought in a form suitable for an intended soldering task. Examples of suitable forms include solder wires, solder rods, solder powders and solder preforms.

The lead-free eutectic solder alloy of the invention can also be used as metal alloy constituent in a solder composition, in particular, as the only metal alloy constituent in a solder composition. Examples of solder compositions include solder pastes and solder wires with fluxes.

The lead-free eutectic solder alloy of the invention or the solder compositions comprising the lead-free eutectic solder alloy of the invention can be used in many applications including mechanical connection and electronic or microelectronic applications. The lead-free eutectic solder alloy of the invention can be used as a brazing alloy in mechanical connection, for example. It can also be used in electronic or microelectronic applications. The solder compositions comprising the lead-free eutectic solder alloy of the invention can in particular be used in electronic or microelectronic applications. Examples of electronic or microelectronic applications include attachment of wafer die to lead frames, attachment of packaged die to heatsink or soldering of leads to printed circuit board.

When performing a soldering task, in particular an electronic or microelectronic soldering task, with the lead-free eutectic solder alloy of the invention (regardless if directly used as solder metal or in the form of a solder composition as mentioned above), it may be expedient to support the soldering process by application of ultrasonic energy to the applied and molten lead-free eutectic solder alloy. Such application of ultrasonic energy may help in preventing formation of voids in the solder and in forming consistent solder joints in terms of homogeneous solder layer thickness as well as solder formation shape regardless of inconsistent solder dot positioning.

EXAMPLES

Eutectic zinc-based alloys 1 to 3 with the following wt.-% composition (zinc as remainder) were made:
1. Zn2.2Mg3.8Al
2. Zn6Al7.2Ge
3. Zn0.35Mg5Al1Ge To this end, the raw materials of ≥99.99% purity were weighed according to their required weight percentage and loaded into a graphite crucible. The graphite crucible was placed in an induction furnace within an enclosed chamber. The chamber was vacuumed to clear the air from the chamber. It was subsequently purged with argon gas before the furnace was started to melt the materials. The average heating ramp rate was 5° C./sec and heating was performed until the zinc was fully melted. The induction furnace allowed for application of a mild stirring to the melt for homogenization purposes. Each of the alloys were cast into a billet of 48 mm diameter after 1 hour. The billets were directly extruded into 0.76 mm diameter solid wire and subsequently wound up by an automatic winder.

The melting behavior of the alloys was analyzed by DSC (differential scanning calorimeter) at a heating rate of 5° C. $\text{min}^{-1}$. The microstructure was analyzed by SEM (scanning electron microscopy) with EDS (energy dispersive spectrometry) and the phases were determined by XRD (X-ray diffraction):

| Alloy | Microstructural/Phases | | Eutectic melting point (° C.) |
|---|---|---|---|
| | Primary Phases | Secondary Phases | |
| 1 | Zn (η, HCP) | $Mg_2Zn_{11}$; Al (α, FCC) | 350 |
| 2 | Zn (η, HCP) | Ge; Al (α, FCC) | 361 |
| 3 | Zn (η, HCP) | Al (α, FCC); Mg0.97Zn0.03; $Al_{12}Mg_{17}$ and $Mg_2Ge$ | 375 |

α/η = different structural phases
HCP = Hexagonal Close Pack
FCC = Face Centered Cubic Each of the alloys exhibited a single melting point (same solidus and liquidus) in the DSC curve and was thus considered a eutectic alloy.

The alloys display similar or better electrical conductivity compared with conventional Pb based alloy and exceptional electrical conductivity compared with Pb based and Sn based alloys (compare the following table). The thermal conductivity was determined using a NanoFlash laser thermal conductivity apparatus on a 3 mm thick sample having a diameter of 13 mm. The electrical conductivity was determined according to ASTM E1008-09 standard on 70 mm long rods of 20 mm diameter.

| Alloys | Melting Temp. (° C.) | | CTE[*] (μm/m·K) | Softening Temp. (° C.) | Thermal Conductivity (W/m·K) | Electrical Conductivity (% IACS) |
|---|---|---|---|---|---|---|
| | Solidus | Liquidus | | | | |
| 1 | 350 | 350 | 24 | 299 | 42.94 | 20.82 |
| 2 | 361 | 361 | 10 | 305 | 60.46 | 23.15 |
| 3 | 375 | 375 | 25 | 302 | 65.60 | 26.60 |
| SnAg25Sb10 | 228 | 395 | 19 | TBD | 55.00 | 11.20 |
| PbSn1Ag1.5 | 313 | 313 | 30 | 304 | 44.00 | 8.10 |

[*]thermal expansion coefficient

The low and single melting point of the eutectic alloys shows advantages in process application by allowing a lower process temperature. They are also not prone to microstructure coarsening or shrinkage void typically observed for non-eutectic alloys.

Each of the alloy wires was used for solder-fixing a 0.4 mm thin silicon-carbide die of 3.1 mm·3.1 mm having a silver contact surface onto a Ni plated leadframe (JEDEC standard TO-220) using a soft solder wire dispensing machine (Besi die bonder Esec 2009 $fS^E$.). Soldering was supported using a programmable ultrasonic module (PUM) from Besi.

The so assembled samples were analyzed for void classification using CSAM (C-mode scanning acoustic microscopy) using a Sonic Echo LS pulse echo with a frequency of 110 MHz. Metallographic samples were prepared by grinding and polishing up to 1 μm diamond using Struers Tegra-Force-5.

Microstructure was studied using Olympus GX51 inverted optical microscope. Scanning Electron Microscopy/Energy Dispersive X-ray Spectroscopy (SEM/EDX) analysis was performed using Ultra Plus FE-SEM from Carl Zeiss.

The soldered samples were tested for their reliability by conducting high temperature storage test (HTS). The samples were held at 245° C. for up to 500 hours. Evaluation criterion was based on DC electrical connectivity (RDSON) at 0, and every 250 hours.

The soldered samples were subject to a thermal cycling test according to standard JESD22-A104D, Condition C. Evaluation criterion was based on DC electrical connectivity (RDSON) at 0, and every 250 cycles.

The soldered samples were subject to a pressure cooker test according to standard JEDEC-STD-22-A102-A, 121° C., 100% RH, 2 atm. Evaluation criterion was based on C-SAM for delamination.

The soldered samples were subject to Moisture Sensitivity Level I test based on JES22-A113-D, under condition 85° C./85% RH for 168 hours+3× reflow, 260° C. Evaluation criterion was based on DC electrical connectivity (RDSON) before and after.

The soldered samples were subject to unbiased HAST (Highly Accelerated Temperature and Humidity Stress Test) based on JESD22-A110B, 130° C./85%/96 hours. Evaluation criterion was based on DC electrical connectivity (RDSON) before and after.

The test results are summarized in the following tables.

| Alloy | Process Application | | HTS Test | | | Pressure Cooker Test |
|---|---|---|---|---|---|---|
| | Visual*) | Voids | 0 h | 250 h | 500 h | |
| 2 | Ok | 10-15% | Passed | Passed | Passed | Passed |
| 3 | Ok | <10% | Passed | Passed | Passed | Passed |

*)visual inspection using an optical microscope at 10X magnification

| Alloy | Thermal Cycling (−65-150° C.) | | MSL | Unbiased |
|---|---|---|---|---|
| | 250 cycles | 500 cycles | Level 1 test | HAST test |
| 2 | Passed | Passed | Passed | Passed |
| 3 | Passed | Passed | Passed | Passed |

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A lead-free solder alloy comprising zinc (Zn) as a main component and aluminum (Al) as an alloying metal, wherein the solder alloy is a eutectic having a single melting point of 350° C. measured by DSC at a heating rate of 5° C. min$^{-1}$, wherein the alloy consists of 3.8 wt. % aluminum (Al), 2.2 wt. % magnesium (Mg), a total of 0 to 0.5 wt. % of one or more doping elements selected from germanium (Ge), phosphorus (P), nickel (Ni), bismuth (Bi), antimony (Sb) and silicon (Si), and remainder zinc (Zn) to make up 100 wt. %.

2. A solder metal present in a form selected from the group consisting of solder wires, solder rods, solder powders and solder preforms, wherein the metal comprises a lead-free solder alloy according to claim 1.

3. A solder composition selected from the group consisting of solder pastes and solder wires with fluxes, wherein the solder composition comprises a lead-free solder alloy according to claim 1.

4. A mechanical connection comprising the solder metal according to claim 2.

5. A mechanical connection comprising the solder composition according to claim 3.

6. An electronic or microelectronic application utilizing the solder metal according to claim 2.

7. An electronic or microelectronic application utilizing the solder composition according to claim 3.

8. A lead-free solder alloy comprising zinc (Zn) as a main component and aluminum (Al) as an alloying metal, wherein the solder alloy is a eutectic having a single melting point of 340° C. measured by DSC at a heating rate of 5° C. min$^{-1}$, wherein the alloy consists of 3.8 wt. % aluminum (Al), 2.2 wt. % magnesium (Mg), 6 wt. % tin (Sn), 2 wt. % silver (Ag), a total of 0 to 0.5 wt. % of one or more doping elements selected from germanium (Ge), phosphorus (P), nickel (Ni), bismuth (Bi), antimony (Sb) and silicon (Si), and remainder zinc (Zn) to make up 100 wt. %.

9. A solder metal present in a form selected from the group consisting of solder wires, solder rods, solder powders and solder preforms, wherein the metal comprises a lead-free solder alloy according to claim 8.

10. A solder composition selected from the group consisting of solder pastes and solder wires with fluxes, wherein the solder composition comprises a lead-free solder alloy according to claim 8.

11. A mechanical connection comprising the solder metal according to claim 9.

12. A mechanical connection comprising the solder composition according to claim 10.

13. An electronic or microelectronic application utilizing the solder metal according to claim 9.

14. An electronic or microelectronic application utilizing the solder composition according to claim 10.

15. A lead-free solder alloy comprising zinc (Zn) as a main component and aluminum (Al) as an alloying metal, wherein the solder alloy is a eutectic having a single melting point of 352° C. measured by DSC at a heating rate of 5° C. min$^{-1}$, wherein the alloy consists of 4.0 wt. % aluminum (Al), 2.25 wt. % magnesium (Mg), 5.85 wt. % silver (Ag), a total of 0 to 0.5 wt. % of one or more doping elements selected from germanium (Ge), phosphorus (P), nickel (Ni), bismuth (Bi), antimony (Sb) and silicon (Si), and balance zinc (Zn) to make up 100 wt. %.

16. A solder metal present in a form selected from the group consisting of solder wires, solder rods, solder powders and solder preforms, wherein the metal comprises a lead-free solder alloy according to claim 15.

17. A solder composition selected from the group consisting of solder pastes and solder wires with fluxes, wherein the solder composition comprises a lead-free solder alloy according to claim 15.

18. A mechanical connection comprising the solder metal according to claim 16.

19. A mechanical connection comprising the solder composition according to claim 17.

20. An electronic or microelectronic application utilizing the solder metal according to claim 16.

21. An electronic or microelectronic application utilizing the solder composition according to claim 17.

22. A lead-free solder alloy comprising zinc (Zn) as a main component and aluminum (Al) as an alloying metal, wherein the solder alloy is a eutectic having a single melting point of 358° C. measured by DSC at a heating rate of 5° C. min$^{-1}$, wherein the alloy consists of 6.0 wt. % aluminum (Al), 6.0 wt. % germanium (Ge), 2.0 wt. % copper (Cu), 1.25 wt. % tin (Sn), a total of 0 to 0.5 wt. % of one or more doping elements selected from phosphorus (P), nickel (Ni), bismuth (Bi), antimony (Sb) and silicon (Si), and remainder zinc (Zn) to make up 100 wt. %.

23. A solder metal present in a form selected from the group consisting of solder wires, solder rods, solder powders and solder preforms, wherein the metal comprises a lead-free solder alloy according to claim 22.

24. A solder composition selected from the group consisting of solder pastes and solder wires with fluxes, wherein the solder composition comprises a lead-free solder alloy according to claim 22.

25. A mechanical connection comprising the solder metal according to claim 23.

26. A mechanical connection comprising the solder composition according to claim 24.

27. An electronic or microelectronic application utilizing the solder metal according to claim 23.

28. An electronic or microelectronic application utilizing the solder composition according to claim 24.

29. A lead-free solder alloy comprising zinc (Zn) as a main component and aluminum (Al) as an alloying metal, wherein the solder alloy is a eutectic having a single melting point of 375° C. measured by DSC at a heating rate of 5° C. min$^{-1}$, wherein the alloy consists of 5.0 wt. % aluminum (Al), 0.35 wt. % magnesium (Mg), 1.0 wt. % germanium (Ge), a total of 0 to 0.5 wt. % of one or more doping elements selected from phosphorus (P), nickel (Ni), bismuth (Bi), antimony (Sb) and silicon (Si), and remainder zinc (Zn) to make up 100 wt. %.

30. A solder metal present in a form selected from the group consisting of solder wires, solder rods, solder powders and solder preforms, wherein the metal comprises a lead-free solder alloy according to claim 29.

31. A solder composition selected from the group consisting of solder pastes and solder wires with fluxes, wherein the solder composition comprises a lead-free solder alloy according to claim 29.

32. A mechanical connection comprising the solder metal according to claim 30.

33. A mechanical connection comprising the solder composition according to claim 31.

34. An electronic or microelectronic application utilizing the solder metal according to claim 30.

35. An electronic or microelectronic application utilizing the solder composition according to claim 31.

* * * * *